United States Patent [19]
Schkrohowsky et al.

[11] Patent Number: 5,477,416
[45] Date of Patent: Dec. 19, 1995

[54] ENCLOSURE WITH METERED AIR DUCTS FOR MOUNTING AND COOLING MODULES

[75] Inventors: Guenter Schkrohowsky, Boise; Cliff Harrison, Eagle; Darrel W. Poulter, Middleton, all of Id.

[73] Assignee: Hewlett-Packard Company, Palo Alto, Calif.

[21] Appl. No.: 388,733

[22] Filed: Feb. 14, 1995

[51] Int. Cl.$^6$ .................................................. H05H 7/20
[52] U.S. Cl. ........................................ 361/695; 361/725
[58] Field of Search ................................. 361/687–697, 361/724–727; 454/184

[56] References Cited

U.S. PATENT DOCUMENTS

| | | | |
|---|---|---|---|
| 3,387,648 | 6/1968 | Ward, Jr. et al. | 361/692 |
| 4,642,715 | 2/1987 | Ende | 361/687 |
| 4,774,631 | 9/1988 | Okuyama et al. | 361/688 |
| 4,858,070 | 8/1989 | Buron et al. | 361/725 |
| 5,414,591 | 5/1995 | Kimura et al. | 361/687 |

Primary Examiner—Gregory D. Thompson
Attorney, Agent, or Firm—E. F. Oberheim

[57] ABSTRACT

An enclosure for cooling device modules has metered air passages in an air duct system. The device modules which are of the form of air ducts are inserted into the air duct system of the enclosure and have exhaust air passages which are coupled to metered air passages in the air duct system of the enclosure. A source of reduced air pressure which is coupled to the air duct system of the enclosure draws air through the device module into the air duct system of the enclosure via the exhaust air passage of the device module and the metered air passage of the air duct system. The metered air passages are graduated in area as a function of their individual distances from the source of reduced air pressure to balance the air volume per unit of time at the respective metered air passages and are further sized in area to have a resistance to air flow which is greater than the air flow resistance of any of the device modules, to minimize changes in air volume rate in the air duct system whether or not device modules are in place in the air duct system of the enclosure.

6 Claims, 3 Drawing Sheets

ENCLOSURE WITH METERED AIR DUCTS FOR MOUNTING AND COOLING MODULES

CROSS REFERENCES TO RELATED APPLICATIONS

Application of Guenter Schkrohowsky et al., Ser. No. 08/388,732, entitled *Enclosure With Redundant Air Moving System*, filed on the same date as this application and assigned to the Assignee of this invention.

1. Field of the Invention

This invention relates to enclosures for mounting and cooling various devices and in particular to enclosures for cooling electronic devices in which metered air passages in the air ducts control air flow volume rates in the air duct system.

2. Background of the Invention

Cooling of electronic devices mounted in enclosures has taken various forms, from the elementary, i.e., simply blowing or drawing air through the enclosure mounting the devices, to applying individual air streams to individual devices. Devices are frequently difficult to access in the enclosures, for servicing or replacement. Balanced air flows in the ducts of such systems are difficult to achieve. When a device is removed from a duct and the device slot is not refilled or plugged, the empty slot creates unacceptable air volume rate disturbances throughout the system, to the end that cooling is generally inadequate, necessitating system shutdown in extreme cases.

Efforts to minimize such air flow disturbances have included the installation of plugs in air ducts from which devices are removed. But even this approach is unsatisfactory since the plug does not characterize the air flow dynamics of the removed device.

Compensation for such disruption of air flow is frequently attempted in over design of the system which is not cost effective.

SUMMARY OF THE INVENTION

A solution to the problems aforesaid is provided, according to the best mode for practicing this invention, by mounting the devices to be cooled in modules which are an easily removable part of the air duct system of the enclosure and by providing metered air passages in the air duct system of the enclosure to control air flow between the module air duct and the air duct system of the enclosure.

The metered air passages control air flow in the air duct at each module location whether or not the module is in place in the system. The metered air passages are also designed to substantially equalize the air volume rates across the metered air passages as a function of the distance of the metered air passages from the air pressure source of the system, in this case a source providing reduced air pressure. The pressure source initiates and maintains air movement in the air ducts.

These metered air openings in the air ducts of the system control the air flow into the air duct from the modules, and the presence or absence of a module in the air duct system at a metered air passage has minimal effect upon the air volume rate across the metered air passage thereat.

This invention, as applied in an enclosure for cooling pluralities of modules, functioned in the worst case situation when only a single module was plugged into the air duct system, to adequately cool the single module.

According to the invention, metered air passages are placed in the walls of an air duct system both to balance air volume rates thereacross at differing distances from the air pressure source and to control air volume rates thereacross whether or not a module is in place thereat in the air duct system.

BRIEF DESCRIPTION OF THE DRAWINGS

The invention will be understood by reference to the following specification when considered in conjunction with the accompanying drawings, in which.

DESCRIPTION OF THE PREFERRED EMBODIMENTS

Figure 1:
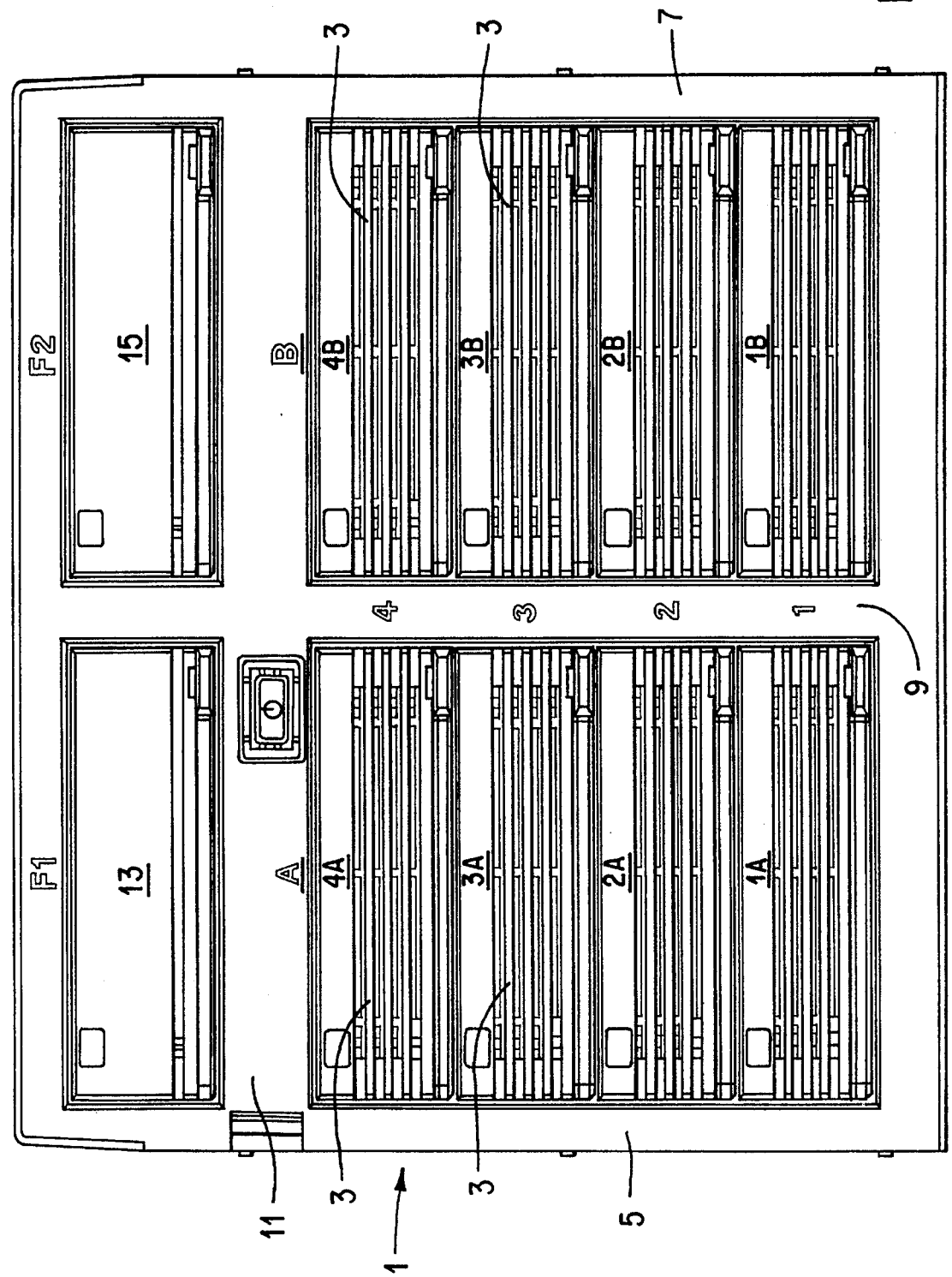
FIG. 1 is a front elevational view of an enclosure for mounting and cooling modules.

A presently known best mode for practicing this invention is disclosed herein in the form of a two bay enclosure 1 for cooling device modules 1A–4A, 1B–4B, which are mounted in respective bays A and B positioned in a side-by-side relationship in the enclosure 1. The four device modules 1A, 2A, 3A and 4A, are disposed in a stack in bay A and the four device modules 1B, 2B, 3B and 4B, are disposed in a stack in bay B. Each device module has a slotted entrance air passage 3 in its front end through which air is admitted to the internal air duct system.

The individual device modules 1A–4A, 1B–4B, are part of an air duct system (see also FIGS. 2, 3 and 4) which includes air ducts 5c and 7c in the side walls 5 and 7 and 9c in a central or common wall 9. The air ducts 5c, 7c and 9c open into an overhead air plenum 11a in an overhead structure 11 of the enclosure 1 which spans the side walls 5 and 7. Individual air movers 13 and 15 located in the overhead structure 11 of the enclosure 1, above the air plenum 11a, communicate with the air plenum. The air movers in this application pull air from the air plenum 11a and exhaust it through the back of the enclosure 1.

When the air pressure is reduced in the air plenum 11a, air is drawn into the air duct system through the slotted entrance air passages 3 in each of the device modules, 1A–4A, 1B–4B, passes therefrom via exhaust air passages 19 in the device modules through metered air passages 5d–5g, 7d–7g and 9d–9g into the air ducts 5c, 7c and 9c in the side walls 5, 7 and common wall 9 and into the air plenum 11a in the overhead structure 11 and is exhausted to the atmosphere via the air movers 13 and 15.

The device modules 1A–4A, 1B–4B, are of a width which spans the enclosure bays A and B between the side walls 5 and 7, respectively, to the central or common wall 9.

While a two bay enclosure is shown, the invention may be practiced employing one or more bays.

With one bay there being no central or common wall 9, the device modules span the distance between the side walls.

With three bays the device modules in the central bay span the distance between the two common walls.

Figure 2:
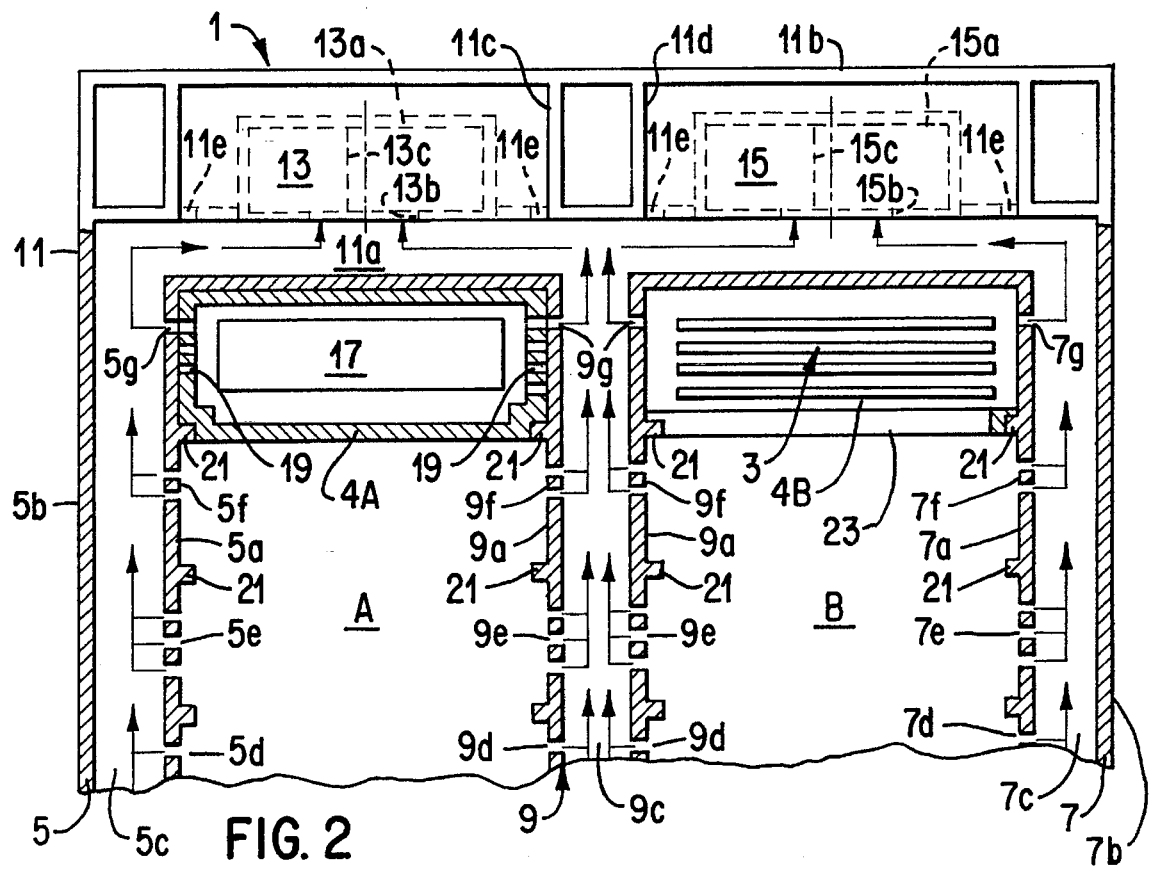
FIG. 2 is a front elevational view, partly in section, of an enclosure with metered air ducts, which embodies the principles of this invention.
Figure 3:
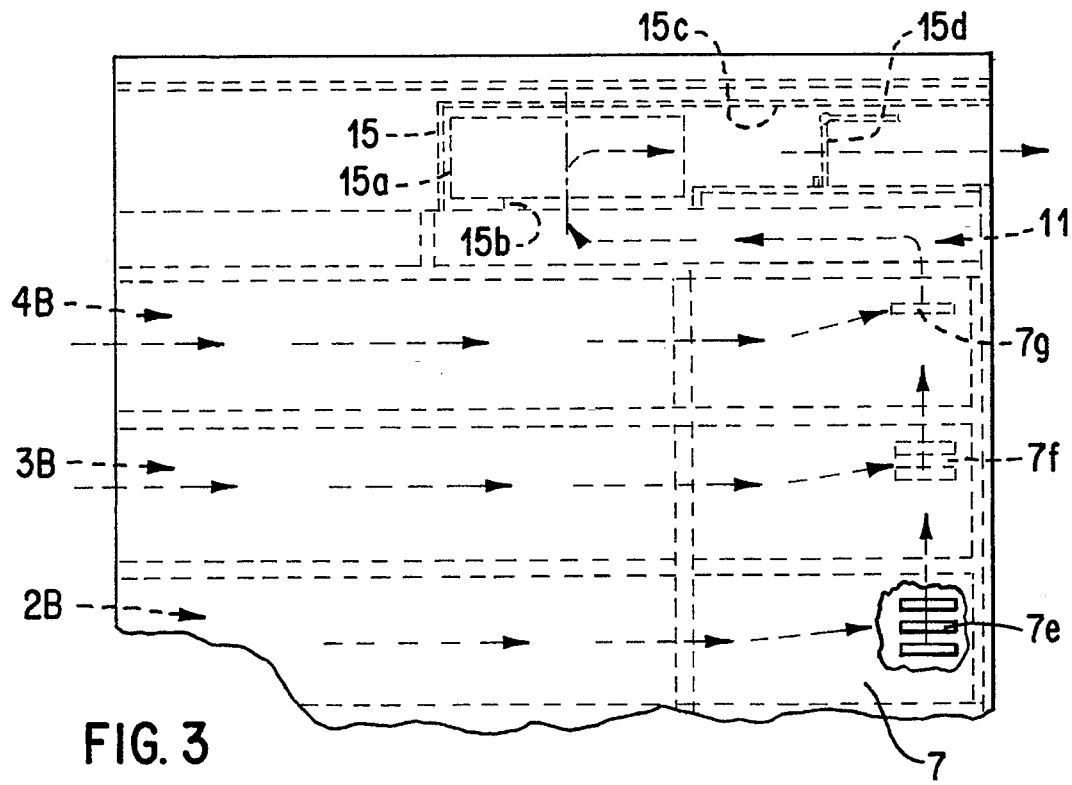
FIG. 3 is a side elevational view of the enclosure of FIG. 1.

FIGS. 2 and 3 depict this invention in greater detail. FIG. 2, which is fragmentarily in section, illustrates the device module 4A in cross section and illustrates the device module 4B in front elevation. Other device modules are not illustrated at this point, since they are not needed in describing this aspect of the invention.

As seen in FIG. 2, the enclosure 1 comprises the pair of laterally spaced side walls 5 and 7, having inner wall surfaces 5a and 7a and an open end 1a spanning the side walls 5 and 7. Laterally spaced wall sections 5a and 5b, 7a and 7b, of the side walls 5 and 7 define therebetween air ducts 5c and 7c, respectively. The spaced wall sections 9a of the common wall 9 define an air duct 9c therebetween. The air ducts 5c, 7c and 9c, at their upper ends, open into an air plenum 11a that spans the enclosure 1. The plenum 11a is defined between the bays A and B and an upper enclosure structure 11b which spans the side walls 5 and 7 and provides slots 11c and 11d which mount air mover modules 13 and 15. The air mover modules 13 and 15 are of the same width as the device modules, 1A–4A, 1B–4B, and slide on tracks 11e, or other structural support, in the bases of the slots 11c, 11d. Each air mover module, 13, 15, comprises a centrifugal fan, 13a, 15a, each of which communicates with the air plenum 11a via an opening 13b, 15b. The centrifugal fans 13a, 15a draw air from the air plenum and exhaust the air through an exhaust air duct, 13c, 15c, (only the duct 150 is visible in FIG. 3) which opens through the back of the enclosure 1. An air pressure opened, gravity biased closed, flapper valve, 13d, 15d, in the respective exhaust air ducts obviates reverse air flow into the air duct system in the event of failure of an air mover module 13 or 15.

The device modules 4A and 4B, as seen in FIG. 2 are rectangular in lateral cross section and are slidably fitted between the sidewalls 5 and 7 and the common walls 9 on tracks 21 which extend between the front and back ends of the enclosure 1. The tracks 21 position the modules, one above the other. The inner wall sections 5a and 7a of the sidewalls 5 and 7 and the opposite walls sections 9a of the common wall, are provided with metered air passages between the tracks 21. The metered air passages for the side wall 5 are, 5d, 5e, 5f and 5g. The metered air passages for the side wall 7 are, 7d, 7e, 7f, and 7g. The corresponding metered air passages for the common wall 9 in the opposite wall sections 9a being identical, are identically identified, 9d, 9e, 9f and 9g.

The metered air passages in FIGS. 2 and 3 are shown as comprising horizontal slots. The correspondingly numbered metered air passages in the best mode configuration of FIG. 4 each comprises 2 rows of slots both of which are vertically disposed. Either orientation is satisfactory.

Figure 4:
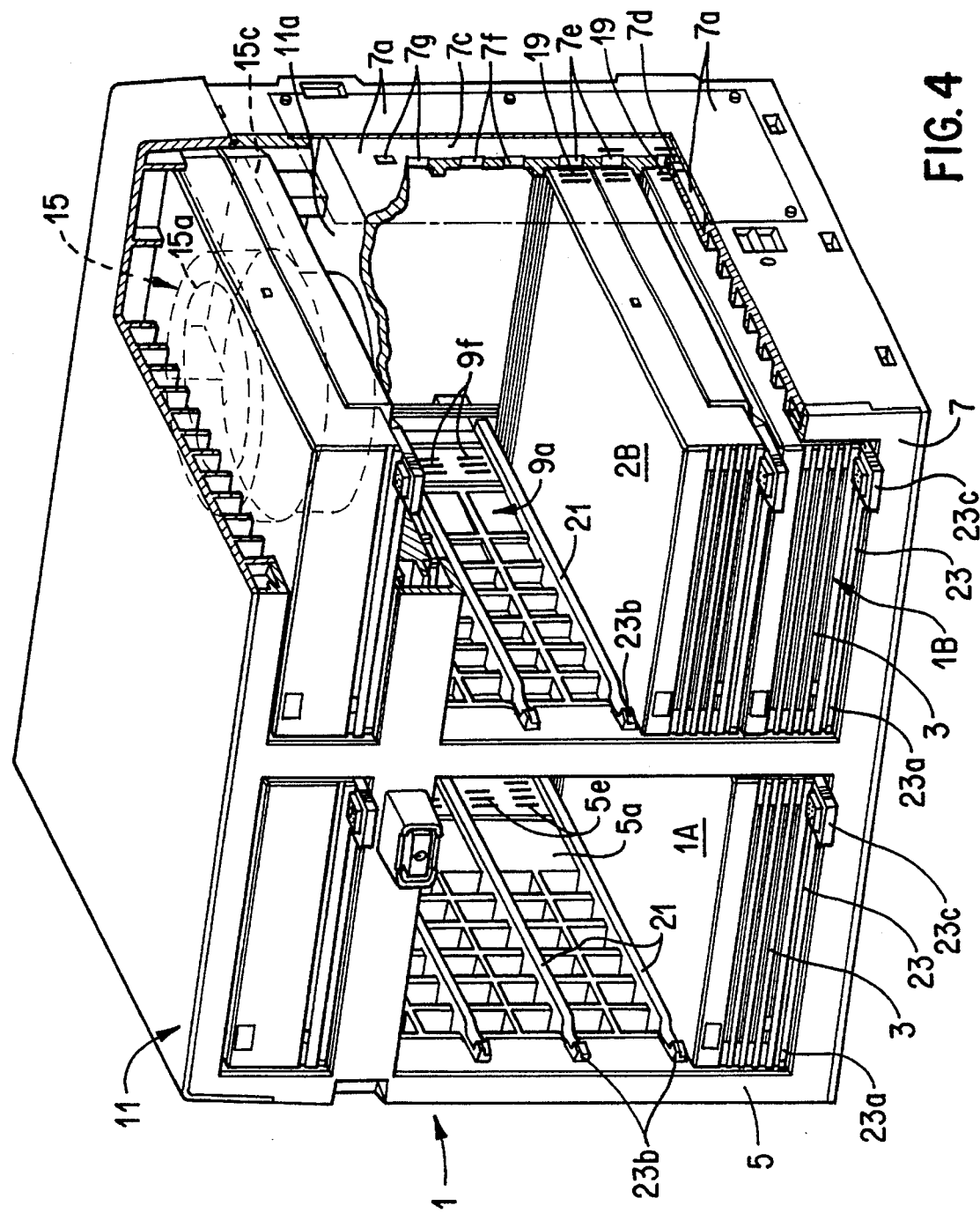
FIG. 4 is an isometric view, fragmentarily in section, of an enclosure for cooling modules, representing the presently known best mode for practicing this invention.

The air passages in FIGS. 2, 3 and 4 decrease in area from the bottom to the top of the enclosure, as seen in FIG. 2. This is accomplished by reducing the number of slots from device module space to device module space, proceeding in the upward direction. In these figures, the reduction is one slot per upward step to compensate the variation in air pressure as a function of the distance from the air pressure source. The reduction in the area of the metered air passage by one slot, stepping upwardly in the air duct, represents but one way of many ways of reducing metered air passage area.

As seen in the device module 4B in FIG. 2, the slots in the end face of the device module 4B define the entrance air passage 3. The entrance air passage 3 admits air to the air ducts in the enclosure 1. The module 4A, being illustrated in section, reveals a device 17 therewithin. Such device may be a disk drive, for example, in a redundant array of inexpensive devices (RAID), or other device to be cooled. The modules, as represented by the device module 4A, define an air duct about the device 17. When inserted in the enclosure 1, the device modules 1A–4A, 1B–4B, become part of the air duct system within the enclosure 1.

As seen in FIGS. 3 and 4, the modules are of rectangular configuration and are of a length which spans the enclosure 1 from the open end 1a at the front of the enclosure to a position at the back wall. An exhaust passage 19 is formed in each of the opposite sides of the device modules at the back end of the device module. Being at the back end of the device module, the air entering the device module at the entrance air passage 3 travels the full length of the device module before exiting at the exhaust passages 19. The exhaust passages 19, as will be described in greater detail, are aligned with the metered air passages 5d–5g, 7d–7g and 9d–9g which communicate with the respective air ducts 5c, 7c and 9c.

The exhaust passages 19 in each module are identical and are of an area which is at least equal to or greater than the area of the largest air duct passage in the air duct system. Air ducts 5c and 7c are defined within the side walls 5 and 7 of the enclosure 1. Air duct 9c is defined between the wall sections 9a of the common wall 9.

The size or area of the metered air passages, as seen in FIGS. 2 and 3, is arbitrary, and is not intended to represent an actual or scaled size, but, rather to show the location of the metered air passages in the wall sections, 5a, 7a and 9a and to illustrate the progressively diminishing size of the metered air passages from the bottom metered air passage, 5d, 7d and 9d, to the top metered air passage, 5g, 7g and 9g, in each air duct. Thus the bottom metered air passage, 5d, 7d and 9d, while not completely detailed in FIG. 2 and not seen in FIG. 3, lacking drawing space, in the progression of slots comprising these metered air passages, each comprise four slots, the metered air passages diminishing by one slot from the bottom to the top of the respective air ducts in the metered air passage progression.

The air flow through the enclosure 1 is seen in FIGS. 2 and 3. When the centrifugal fans 13a, 15a in the air mover modules 13 and 15 are running, air is exhausted from the enclosure duct system through the exhaust ducts, 13c, 15c, which open through the back wall of the enclosure 1. Air is now drawn into the enclosure duct system through the entrance air passages 3 at the front ends of the modules, 1A–4A, 1B–4B, passing through the modules and transitioning through the module exhaust air passages 19 and aligned meter air passages, 5d–5g, 7d–7g and 9d–9g, into the air ducts, 5c, 7c and 9c, and thence into the air plenum 11a. From the air plenum 11a the air is exhausted to the atmosphere via the centrifugal fans 13 and 15.

By selecting the largest area of a metered air passage of all of the metered air passages, 5d–5g, 7d–7g and 9d–9g, so that the resistance to the air flow thereat is greater than the resistance to the air flow of any one of all of the device modules, each metered air passage predominately characterizes the air flow thereat into an air duct 5c, 7c or 9c whether or not a device module is present at that location, resulting in minimal air flow disturbance in the enclosure duct system regardless of the number of modules in the enclosure.

By progressively scaling the area of the metered air passages as a function of the distance of the metered air passage from the air pressure source, the individual volumes of air flow per unit of time at the differing metered air passages are substantially equal.

The cutaway isometric view of the best mode for practicing this invention, seen in FIG. 4, differs primarily in the detail of execution from the schematic depiction of the invention of FIGS. 2 and 3 by having vertical instead of horizontal slots. One such detail is seen in the slots which comprise the metered air passages into the air ducts 5c, 7c and 9c and the slots which comprise the exhaust air passages 19 of the device modules. Either the horizontal or vertical orientation of the slots is satisfactory. Each metered air passage comprises two rows of slots. The bottom metered air passage 5d, 7d and 9d, in each wall, comprises two rows of four slots. This is seen fragmentarily at 7d in the side wall 7. Proceeding upwardly to the next device module row, the metered air passages 5e, 7e and 9e, 5e being seen in the side wall 5, comprise seven slots. Proceeding upwardly to the next device module row the metered air passages 5f, 7f and 9f each comprise six slots, as seen in the metered air passage 9f in the common wall 9. This scaling of the metered air passages continues through the upper metered air passages to the upper most row 5g, 7g and 9g where the slot count is five.

Each device module is provided with exhaust air passages comprising two rows of four slots each. This is partially seen at 19 on the bottom device module 1B. The metered air passages of the air ducts 5c, 7c and 9c and the exhaust air passages 19 of the modules 1A–4A and 1B–4B are depicted approximately to scale. The device modules each slide on tracks or rails 21 mounted to the respective side walls 5, 7 and 9. These rails are vertically spaced and precisely position the modules in the enclosure 1. The modules extend from the open front end of the enclosure 1 to the back of the enclosure.

The front to back location of each of the modules is controlled by a pivoted latch mechanism 23 having a latch end 23a which engages a catch 23b on the front end of each track 21, to latch the module in a precise longitudinal position. A latch handle 23c locks the pivoted latch in latch position. The details of this latch mechanism are not illustrated since they do not comprise a part of the invention which is claimed herein.

What is claimed is:

1. An enclosure assembly for housing and cooling modules, comprising:
   a. a pair of laterally spaced walls having integral air ducts, each wall further comprising laterally spaced wall sections defining said air ducts within each wall, the respective air ducts opening through corresponding upper ends of said walls;
   b. an enclosure structure capping said corresponding openings of said walls and forming an air plenum therewithin communicating with said air ducts;
   c. wall sections of said walls within said enclosure having metered air passages therethrough providing communication with each said air ducts thereat;
   d. modules disposed between and mounted to adjacent inner wall surfaces of said walls, each module having an entrance air passage at one end thereof at said open end of said enclosure and exhaust air passages on opposite sides of said module at locations removed from said entrance air passage, each said exhaust air passage being aligned with a metered air passage in an adjacent wall section of said walls, and
   e. means for exhausting air from said air plenum to reduce air pressure therein and induce airflow into said entrance air passage of each module, through said each exhaust air passage of each said module and aligned metered air passage, through each air duct into said air plenum and through said air mover to the atmosphere.

2. The enclosure assembly according to claim 1, in which:
   a. said modules are positioned one above the other, between said inner wall surfaces of said walls of said enclosure, and said metered air passages are correspondingly positioned in said wall sections, one above the other, in alignment with respective said module exhaust passages.

3. The enclosure assembly according to claim 2, in which:
   a. the area of said metered air passages decreases incrementally upwardly from the bottom metered air passages.

4. The enclosure assembly according to claim 2, comprising:
   a. tracks spaced one above the other on each said inner wall surfaces of said walls, extending from said open end of said enclosure inwardly of said enclosure, for receiving and guiding said modules during their insertion and removal through said open end of said enclosure and for positioning said modules within said enclosure with said exhaust air passages aligned with said metered air passages in said wall sections.

5. The enclosure assembly according to claim 3, in which:
   a. said exhaust air passages in said modules are each at least of the same area as the largest of said metered air passages.

6. An enclosure assembly for housing and cooling modules, comprising:
   a. a pair of laterally spaced side walls and at least one common wall between said side walls, said side walls and said common wall having front ends, back ends, and upper ends, said enclosure being open between each side wall and said at least one common wall at said front ends of each and being closed at said back ends of each, each side wall and said at least one common wall having laterally spaced wall sections defining an air duct within the wall, the respective air ducts opening through said upper ends of said side walls and said at least one common wall;
   b. an enclosure structure enclosing said upper ends of said side walls and said at least one common wall and forming an air plenum therewithin communicating with said air ducts;
   c. wall sections of the side walls within said enclosure and both wall sections of said at least one common wall having each metered air passages therethrough providing communication with said air ducts thereat;
   d. modules disposed between and mounted to adjacent surfaces of said side walls and said at least one common wall, each module having an entrance air passage at one end thereof at said open end of said enclosure and an exhaust air passage on opposite sides of said each module at locations removed from said entrance air passage, each said exhaust air passage being aligned with a metered air passage in an adjacent wall section.

* * * * *